(12) United States Patent
Ren et al.

(10) Patent No.: US 7,508,021 B2
(45) Date of Patent: Mar. 24, 2009

(54) RF POWER TRANSISTOR DEVICE WITH HIGH PERFORMANCE SHUNT CAPACITOR AND METHOD THEREOF

(75) Inventors: Xiaowei Ren, Phoenix, AZ (US); Daniel J. Lamey, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/760,775

(22) Filed: Jun. 10, 2007

(65) Prior Publication Data

US 2007/0297120 A1 Dec. 27, 2007

(51) Int. Cl.
*H01L 27/108* (2006.01)

(52) U.S. Cl. .................. 257/296; 257/318; 257/532; 361/309

(58) Field of Classification Search .......... 257/296, 257/318, 532; 438/262; 361/309
See application file for complete search history.

(56) References Cited

U.S. PATENT DOCUMENTS

| 5,351,163 | A | 9/1994 | Dawson et al. |
| 6,208,500 | B1 | 3/2001 | Alexander et al. |
| 6,218,239 | B1* | 4/2001 | Huang et al. ............... 438/253 |
| 6,331,931 | B1 | 12/2001 | Titizian et al. |
| 2003/0020107 | A1* | 1/2003 | Bosco et al. ............... 257/296 |

* cited by examiner

*Primary Examiner*—Long K Tran
(74) *Attorney, Agent, or Firm*—Michael J. Balconi-Lamica

(57) ABSTRACT

An integrated shunt capacitor comprises a bottom plate (86, 88), a capacitor dielectric (92) overlying a portion of the bottom plate, a top plate (62) overlying the capacitor dielectric, a shield (74) overlying a portion of the top plate (62); and a metallization feature (70) disposed about and isolated from at least two sides of the top plate (62), the metallization feature (70) for coupling the bottom plate (86,88) to the shield (74). In one embodiment, an RF power transistor has an impedance matching network including an integrated shunt capacitor as described herein.

20 Claims, 10 Drawing Sheets

RF POWER TRANSISTOR DEVICE WITH HIGH PERFORMANCE SHUNT CAPACITOR AND METHOD THEREOF

BACKGROUND

The present disclosures relate to RF devices, and more particularly, to an RF power transistor device with a high performance shunt capacitor and method thereof.

RF transistor designs have traditionally included an integrated shunt capacitor design; however, the traditional integrated shunt capacitor has poor RF performance. In other words, such a traditional integrated shunt capacitor design degrades the RF power transistor's power, gain and efficiency. Such degradation in RF power transistor performance is especially noticeable in high power RF power transistor plastic package designs.

In a known high power RF device, wires and on-chip high Q metal-insulator-metal (MIM) shunt capacitors are used to achieve input and output impedance matching of the high power RF devices. However, such MIM shunt capacitors are fabricated on a separate chip which has a refractory metal substrate. Accordingly, the MIM shunt capacitors are incompatible, and cannot be integrated, with LDMOS silicon based processes.

Accordingly, there is a need for an improved method and apparatus for overcoming the problems in the art as discussed above.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
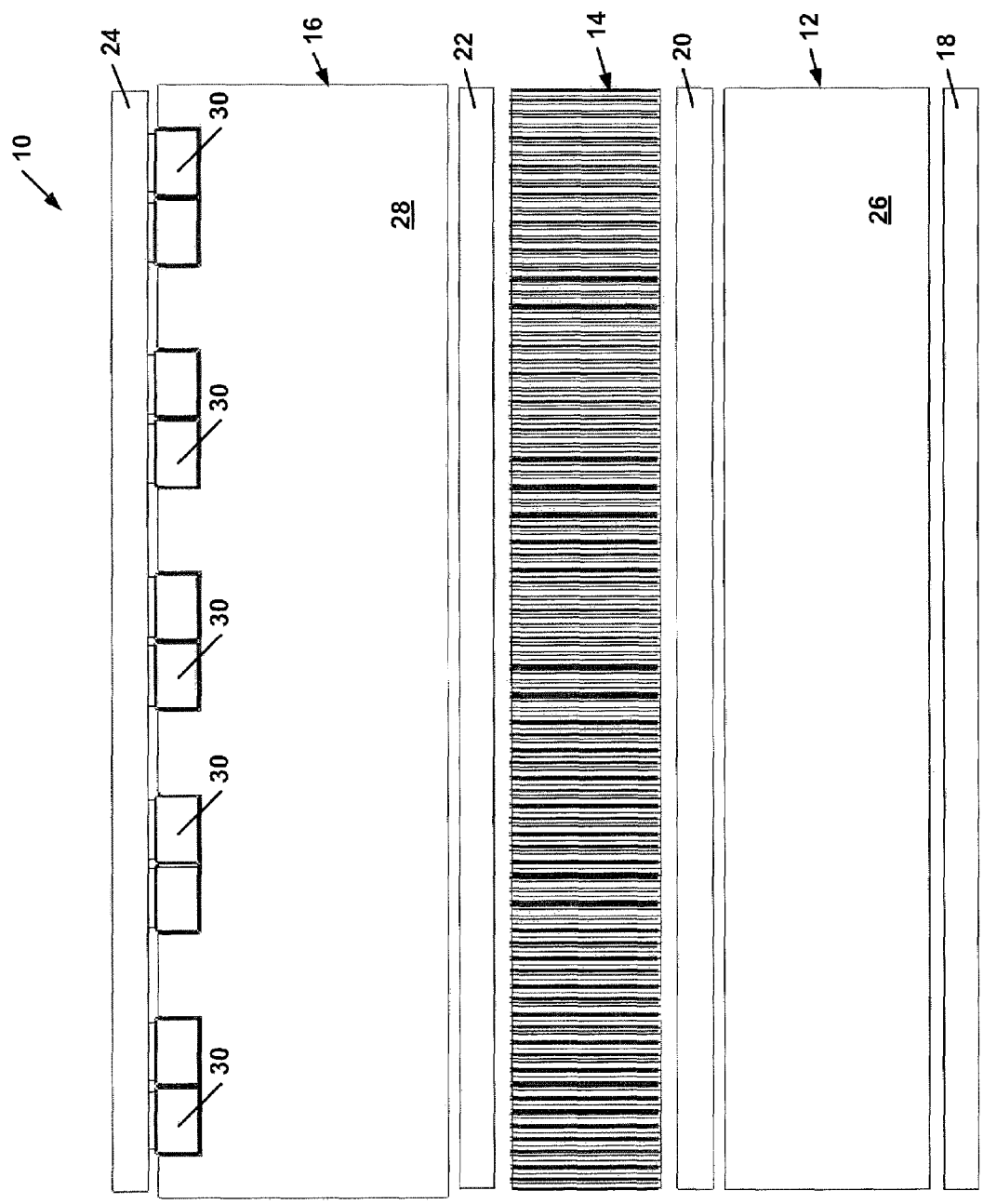
FIG. 1 is a top down layout view of a portion of an RF MOSFET design known in the art.

FIG. 1 is a top down layout view of a portion of an RF MOSFET design 10 known in the art. In particular, the RF MOSFET design 10 includes an RF power amplifier with integrated impedance matching networks. The amplifier 10 includes of an input impedance matching network 12, an active device 14, and an output impedance matching network 16. Active device 14 includes, for example, an RF power transistor. The input impedance matching network 12 comprises bus bar bonding pads 18 and 20. The output impedance matching network comprises bus bar bonding pads 22 and 24.

The input impedance matching network further includes a ground shield 26 for providing shielding of the input impedance matching network bond wires (not shown), which would typically connect to and extend between bonding pad bus bars 18 and 20. The input impedance matching network ground shield 26 generally includes metallization connected to ground to reduce losses due to currents in bond wires (not shown) disposed over the corresponding area of the input impedance matching network. The input impedance matching network 12 further includes integrated input capacitors (not shown), proximate the bonding pad bus bar 18.

In addition, the output impedance matching network 16 includes a ground shield 28 for providing shielding of the output impedance matching network bond wires (not shown), which typically connects to and extends between bonding pad bus bars 22 and 24, as well as any additional bond wires (not shown) connecting bonding pad bus bar 22 to the IC package off chip. The output impedance matching network also includes shunt capacitors 30, wherein the shunt capacitors 30 are connected to bonding pad bus bar 24 via on-chip metallization. As illustrated, the shunt capacitors 30 are placed as an array adjacent to the bonding pad bus bar 24, which is adjacent to the ground shield 28 for the output impedance matching network 16.

Figure 2:
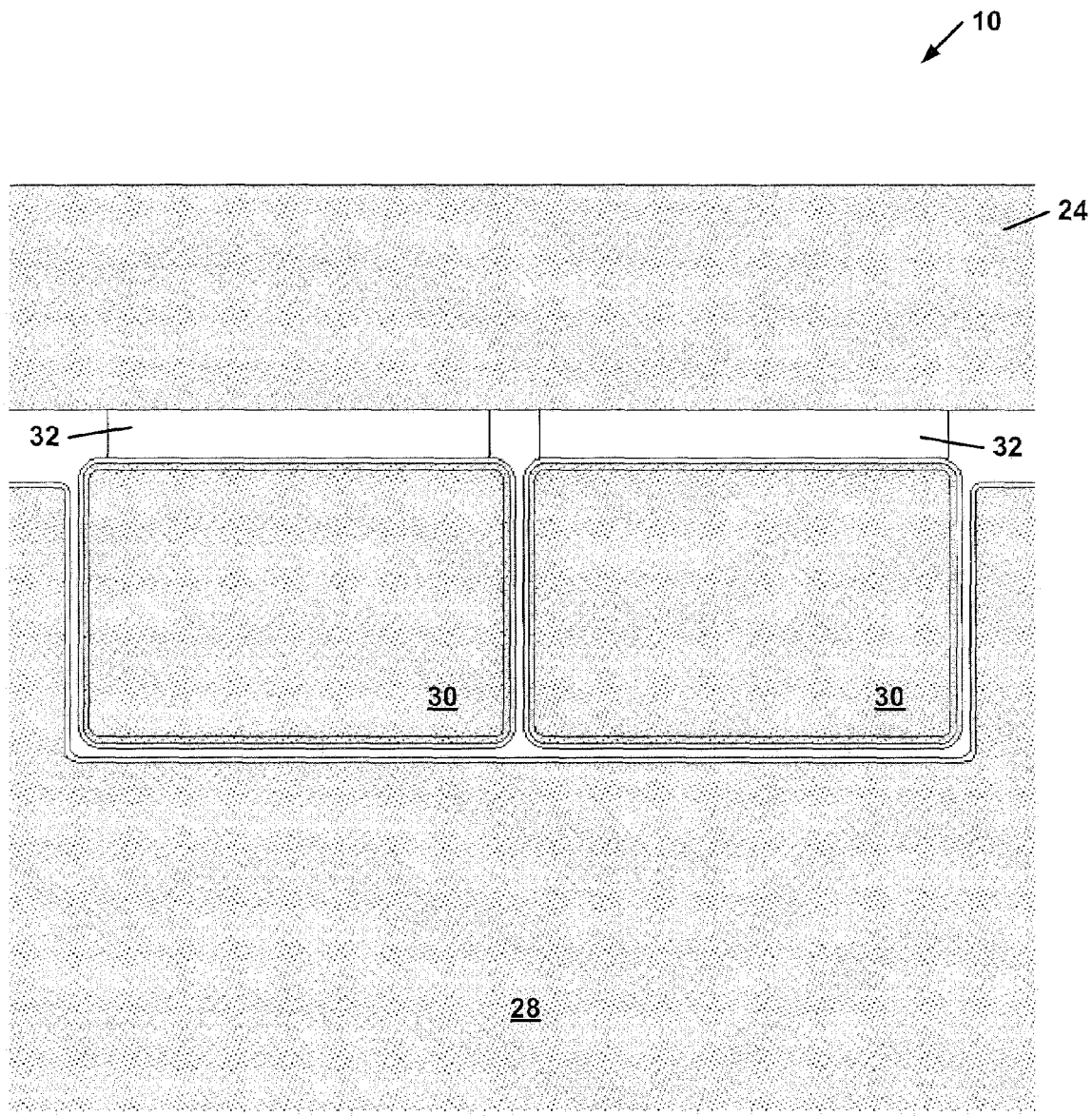
FIG. 2 is a top down layout view of a portion of the RF MOSFET design of FIG. 1, in greater detail.

FIG. 2 is a top down layout view of a portion of the RF MOSFET design 10 of FIG. 1, in greater detail. The portion of the RF MOSFET design 10 illustrated includes portions of bonding pad bus bar 24, output impedance matching network ground shield 28, and two adjacent shunt capacitors 30. FIG. 2 further illustrates metallization 32 which couples a corresponding shunt capacitor 30 to the adjacent bonding pad bus bar 24. Shunt capacitors 30 are characterized by a large rectangular shape. In addition, note that while the output ground shield 28 is disposed proximate to shunt capacitors 30 (i.e., within corresponding manufacturing tolerances), the output ground shield 28 does not overlie any portion of shunt capacitors 30.

Figure 3:
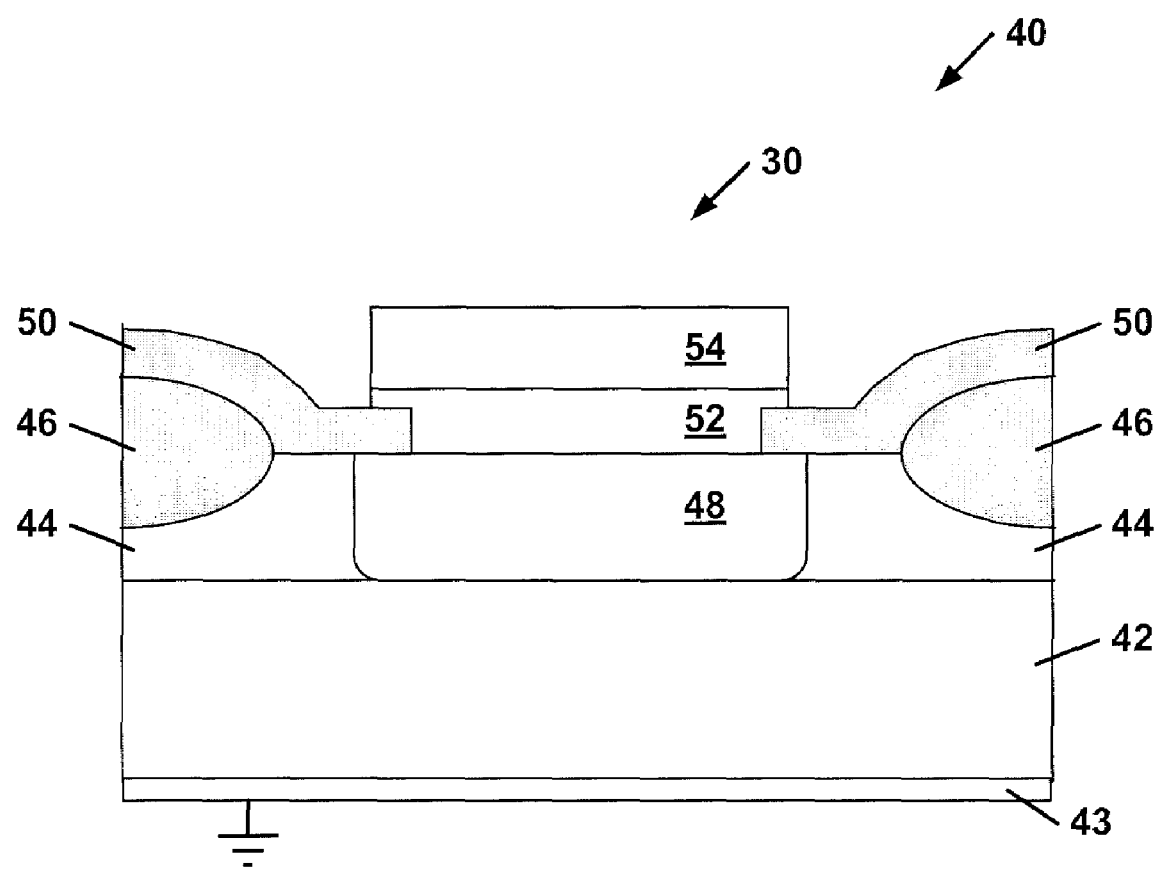
FIG. 3 is a cross-section view of a shunt capacitor design as implemented in the RF MOSFET design of FIG. 1.

FIG. 3 is a cross-section view 40 of a single shunt capacitor 30 as implemented in the RF MOSFET design of FIG. 1. The cross section 40 includes a silicon substrate 42, which is heavily doped. For example, substrate 42 may comprise a P-type silicon substrate. A backside metal 43 is provided on the backside of substrate 42 for providing grounding of the substrate. A lightly doped silicon epitaxial layer 44 overlies the heavily doped silicon substrate 42. Epitaxial layer 44 may comprise, for example, a P– epitaxial layer. The epitaxial layer 44 is used in the fabrication of the shunt capacitor 30 and RF LDMOS 10. Various semiconductor manufacturing process steps are known in the art, and thus, not described in detail herein.

The shunt capacitor bottom plate 48 comprises an ion implantation region fabricated within the silicon epitaxy layer 44, wherein a high temperature treatment is carried out following the ion implantation so that the bottom plate electrically connects to the underlying heavily doped silicon substrate 42. Bottom plate 48 may comprise, for example, a P+ sinker. Field oxide regions 46 and inter-level dielectric layer 50 (ILD) provide device isolation for shunt capacitor 30. Dielectric layer 52 comprises the dielectric of the shunt capacitor and is formed overlying the shunt capacitor bottom plate 48. For example, dielectric layer 52 may comprise nitride. The top capacitor plate 54 is formed on dielectric 52, for example, using suitable metal deposition, photolithography, and etching techniques. For example, top plate 54 may comprise AlCuW.

In RF applications, the quality factor (Q) of a shunt capacitor is defined by the ratio of energy stored in the capacitor to energy dissipated through resistive loss. In the shunt capacitor 30 of FIG. 3, the silicon bottom plate 48 has an inherent higher series resistance compared to the top metal plate 54. The top and bottom plates 54 and 48, respectively, also suffer from inefficient charge distribution with the respective plates. In addition, the contact resistance of the bottom plate 48 to ground potential is also high, due to the limited contact area and the doping concentration at the connection interface between the bottom plate 48 and substrate 42. Furthermore, the top plate 54 is exposed and thus without protection against potential interference. Such interference may originate, for example, from currents in bond wires that overhang the capacitor.

In addition, for high power RF transistor applications, the shunt capacitor arrangement is critical for providing a high performance capacitor. As illustrated in FIG. 2, shunt capacitors 30 are arranged in an array next to (or adjacent) the wire bond bus bar 24. The series resistance from a bonding point on the wire bond bus bar 24 to the shunt capacitor 30 is high. Accordingly, there exists an inefficient charge distribution from a given bond-wire (not shown) to the corresponding shunt capacitor(s) 30. Furthermore, the distance between the shunt capacitors 30 to a respective corresponding bonding point (not shown) on the wire bond bus bar 24 is not generally uniform. The combination of these factors, with respect to shunt capacitors 30 and in connection with the input and output impedance matching networks of a high power RF transistor device, results in poor capacitor Q and limited RF performance of the corresponding RF transistor device.

Figure 4:
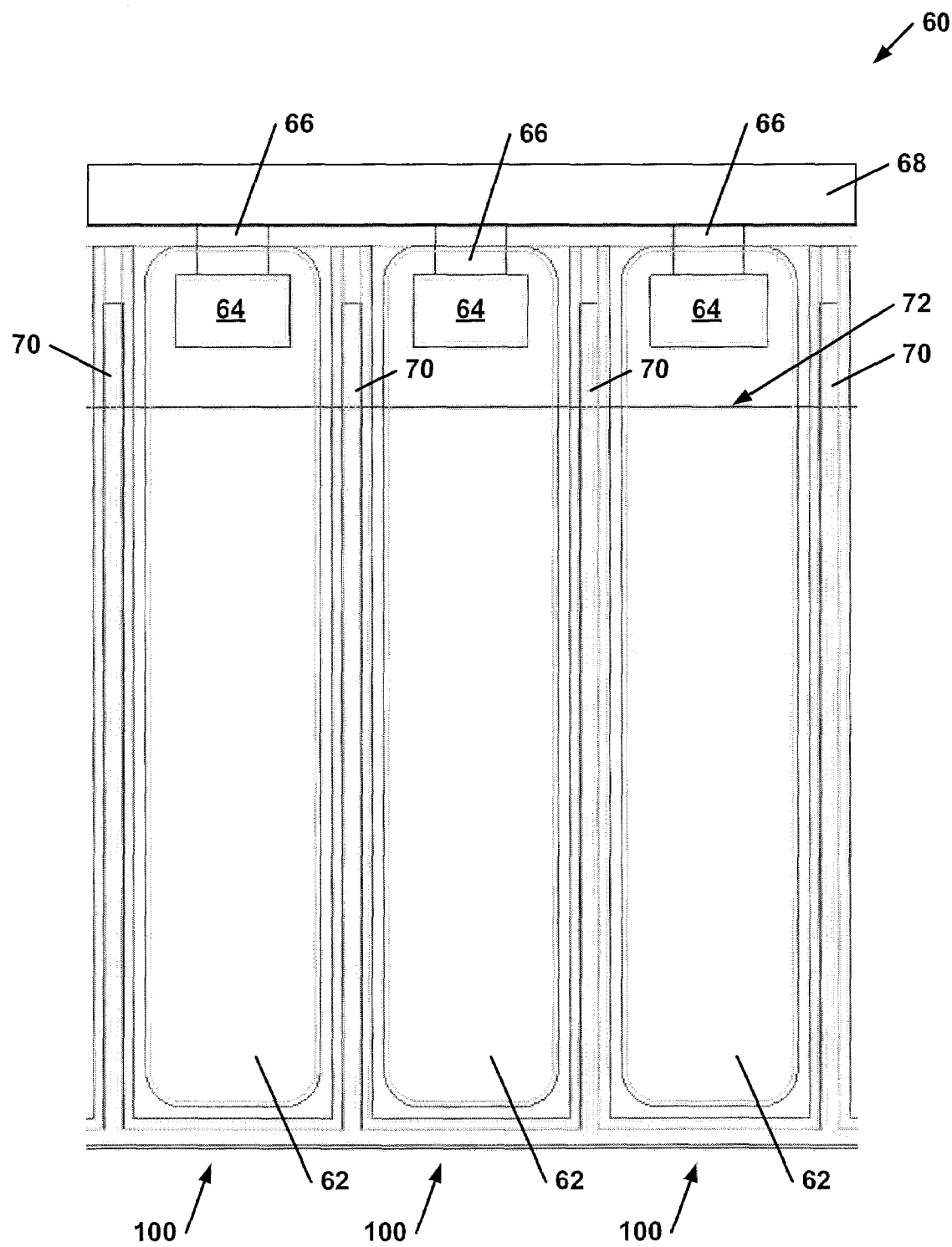
FIG. 4 is a top down layout view of a portion of a shunt capacitor design for an RF power transistor according to an embodiment of the present disclosure, with some features illustrated in a transparent view.

FIGS. 4-9 illustrate various views of the novel shunt capacitor structure according to the embodiments of the present disclosure. FIG. 4 is a top down layout view of a portion of a shunt capacitor design 60 for an RF power transistor according to an embodiment of the present disclosure, with some features illustrated in a transparent view. FIG. 4 illustrates three shunt capacitors 100 arranged in a row. Each shunt capacitor 100 is representative of a unit cell, as will be discussed further herein with respect to FIGS. 6 and 7, and for which the unit cell pattern can be repeated or replicated a desired number of times according to the requirements of a given RF power transistor application.

The shunt capacitor top plates are generally indicated by reference numeral 62. The shunt capacitor top plates couple via a metallization (generally indicated by reference numerals 64 and 66) to an adjacent bond pad 68, wherein only a small portion of the bond pad is illustrated in FIG. 4. A better appreciation for bond pad 68 will be discussed further herein with reference to FIGS. 8 and 9. Metallization(s) in the form of U-shaped features, such as indicated by reference numeral 70, extend along a length dimension on two sides and along a width dimension on one side of each shunt capacitor. In FIG. 4, reference numeral 72 identifies a boundary of a grounding shield (to be discussed in connection with FIG. 5) that extends over a portion of the shunt capacitor 100. In addition, the metallization(s) will be further discussed herein with reference to FIGS. 6 and 7.

Further with respect to FIG. 4, the shunt capacitor makes use of a conductive layer, which in one embodiment, includes tungsten silicide, as the bottom capacitor plate. It is noted that the high voltage and large capacitance density requirements of a given high power RF transistor application preclude the use of other metal-insulator-metal capacitors typically used in the industry. In part, this is because the temperature limitations imposed by a metal bottom plate are incompatible with a high temperature CVD nitride dielectric. FIG. 4 illustrates the layout of the shunt capacitor with three instances of a basic unit cell, with a metal 2 shown in outline.

Figure 5:
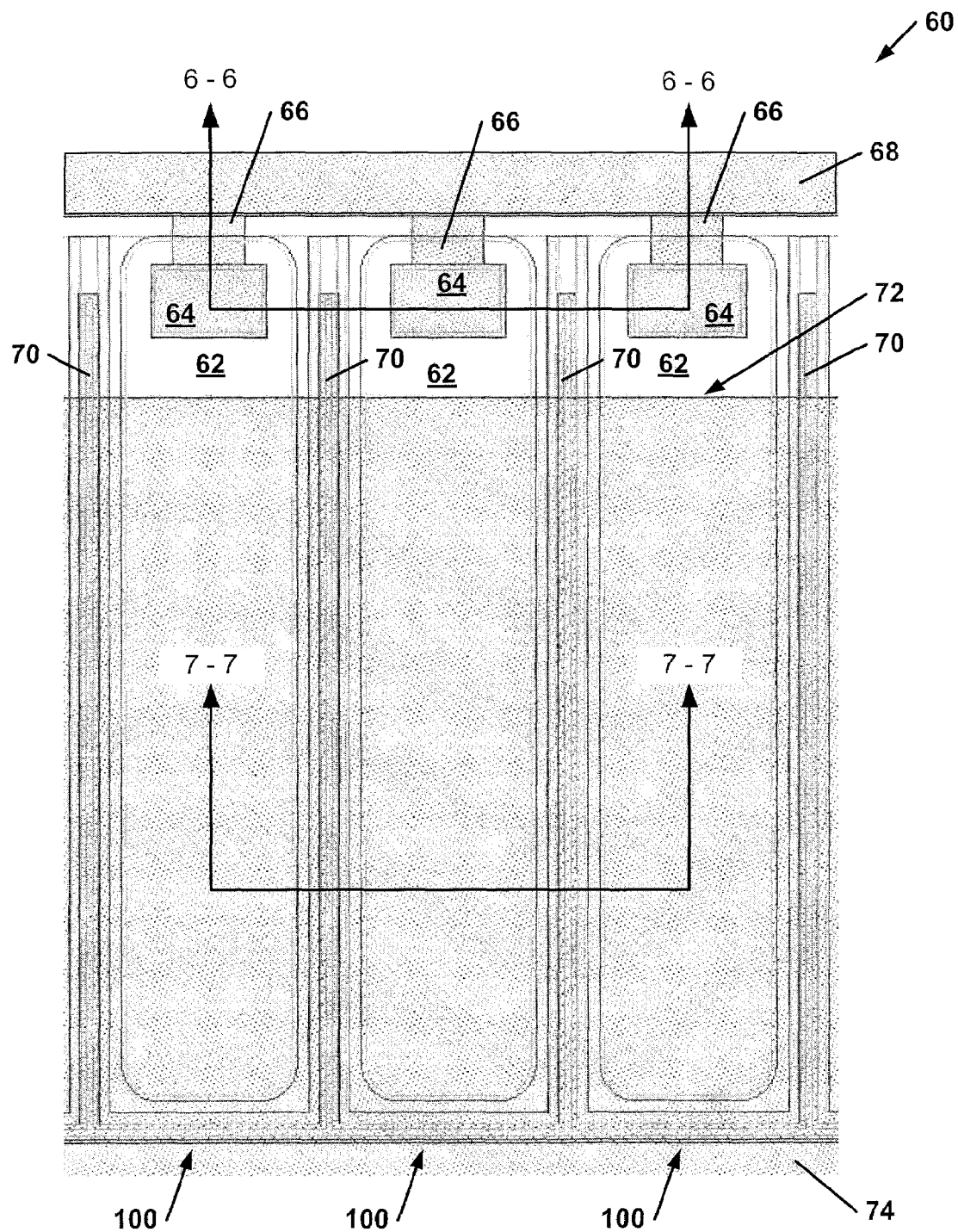
FIG. 5 is a top down layout view of the portion of the shunt capacitor design of FIG. 4, with the transparent view features of FIG. 4 illustrated in an opaque view.

FIG. 5 is a top down layout view of the portion of the shunt capacitor design of FIG. 4, with the transparent view features of FIG. 4 illustrated in an opaque view. FIG. 5 is similar to FIG. 4; however a top metallization is illustrated in FIG. 5. The top metallization includes regions 64 and 66, as well as the small portion of the bond pad 68, as illustrated in FIG. 5. The top metallization further includes the U-shaped structures 70 and ground shield 74 (only a portion of ground shield 74 is illustrated).

In other words, the highlighted regions of FIG. 5 represent a top metal layer. The regions include the U-shape structures 70 and a portion of the ground shield 74, wherein the U-shape structures are all coupled to ground potential through ground shield 74. Also highlighted top metal regions are the metal via connection 64 (to the capacitor top plate 62) and the metal connection 66 (between the metal via to the bonding pad) and the partial wire pond pad 68. In one embodiment, such as illustrated, with the exception of a region proximate the connection of the top plate to the wire bond pad, the majority of the shunt capacitor 100 is shielded under the ground shield 74. The portion of the shunt capacitor that is shielded by the ground shield 74 can be tailored as desired for the requirements of a given RF power transistor application. For example, the portion may comprise 25%, 50%, 75%, or other percentage as may be appropriate for a given RF power transistor application.

Figure 6:
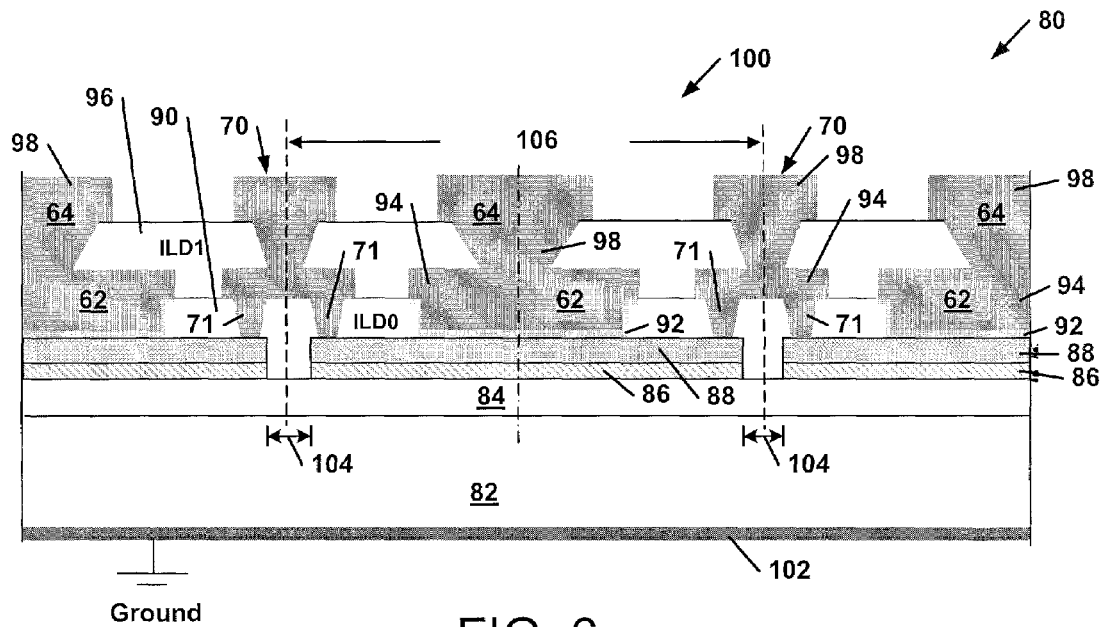
FIG. 6 is a cross-section view of the shunt capacitor design of FIG. 5, taken along line 6-6.

FIG. 6 is a cross-section view 80 of the shunt capacitor design of FIG. 5, taken along line 6-6. Cross-section view 80 contains substrate 82, isolation layer 84, lower capacitor plate (i.e., bottom plate) conductive layers 86 and 88, a first inter-level dielectric 90, a shunt capacitor dielectric 92, a first layer metallization 94, a second inter-level dielectric 96, and a second layer metallization 98. Reference numeral 100 indicates a unit cell implementation of the shunt capacitor according to the embodiments of the present disclosure, wherein the unit cell pitch is indicated by reference numeral 106. As shown in the cross-section view 80 of FIG. 6, a gap 104 is illustrated that occurs between the bottom plate conductive layers (86,88) of adjacent unit cells 100. In one embodiment, gap 104 is non-existent, wherein the bottom plate conductive layers (86,88) of adjacent unit cells 100 are merged together. In another embodiment, the spacing of gap 104 is determined according to the requirements of a given RF power transistor application.

In one embodiment, substrate 82 comprises any substrate suitable for a given RF power transistor application. For example, substrate 82 may comprise a P-type silicon substrate. Isolation layer 84 comprises any isolation layer suitable for a given RF power transistor application. Isolation layer 84 can comprise, for example, an oxide. Lower capacitor plate (i.e., bottom plate) conductive layers 86 and 88 comprise any conductive layers suitable for a given RF power transistor application. Conductive layers 86 and 88 can comprise, for example, a polysilicon layer and a tungsten silicide layer, respectively. First and second level inter-level dielectrics 90 and 96 comprise any suitable inter-level dielectric for a given RF power transistor application. Shunt capacitor dielectric 92 comprises any suitable capacitor dielectric for a given RF power transistor application. For example, shunt capacitor dielectric 92 may comprise a nitride. Furthermore, first and second layer metallizations 94 and 98 comprise any suitable metallization material for a given RF power transistor application.

Further with reference still to FIG. 6, the cross section 80 illustrates a section of the device 60 of FIG. 5 that includes a unit call 100 and partial adjacent cells. Substrate 82 comprises any suitable single or multi-layer substrate. For example, substrate 82 may comprise a highly doped silicon substrate with lightly doped silicon epitaxy layer overlying the highly doped silicon substrate, or other combination of layers, which may be more suitable or desirable in some devices. Oxide layer 84 is fabricated overlying substrate 82. In one embodiment, oxide layer 84 can comprise a field oxide. In another embodiment, oxide layer 84 can comprise a gate oxide.

A conductive bottom plate (cumulatively shown as layers 86 and 88) of the shunt capacitor 100 is formed over oxide layer 84. The conductive bottom plate can comprise a single layer metal or a multi-layer metal. The conductive bottom plate may also comprise poly silicon followed by silicidation. For example, the conductive bottom layer may comprise doped poly silicon layer 86 followed by WSi layer 88. Gap 104, illustrated within the bottom conducting plate (86,88) may be present or absent, wherein in the absence of gap 104, the bottom conducting plate (86,88) between adjacent unit cells 100 are merged.

Inter-level dielectric (ILD0) 90 is formed and patterned, thus creating isolation blocks in between the capacitor top plate 62 and the metal contact 71 to the bottom plate (86,88). The dielectric layer 92 of the shunt capacitor is fabricated in the center region of each unit cell 100. The top capacitor plate 62 is formed by first layer metal 94 (M1 or metal1). The M1 layer 94 can comprise a single layer metal or multi-layer metal. The connection of the capacitor top plate 62 to wire bond pad is formed through a via etch of the second inter-level dielectric layer 96 (ILD1) and second layer metal 98 (M2 or metal2), as shown at the center structure 64. The stacked structures at the edges of the unit cell 100 are formed by contacting the bottom plate (86,88) using the contact and first layer metal structure 71 and the via and second layer metal structure 70. As shown in FIG. 6, the stacked structures (70, 71) comprise the cross-sections of two legs along a length dimension of the unit cell 100 of the U-shape structure 70 of FIG. 5. A backside metal 102 provides a backside ground contact to the RF transistor device. Note that the ground is not limited by connecting from the backside alone; whereas the topside ground can be equivalently effective for the RF transistor device according to the embodiments of the present disclosure.

In one embodiment, the bottom plate (86,88) of shunt capacitor 100 comprises a silicon bottom plate. In another embodiment, the bottom plate (86,88) comprises a more conductive plate (i.e. poly silicon with WSi stack) to reduce a corresponding intrinsic series resistance. The narrow strip bottom plate (86,88) (as illustrated in the top down layout view) with the U-shape contact (70,71) to the ground shield metal (98) of ground shield 74 further reduces the series resistance of the bottom plate (86,88), and reduces the contact resistance and the series resistance to ground. In other words, the grounded M2 layer 98 (corresponding to ground shield 74), which overlies the top capacitor plate 62, is coupled to the bottom plates (86,88) and primarily provides a low impedance path to the ground metal for the shunt capacitor bottom plates (86,88).

Figure 7:
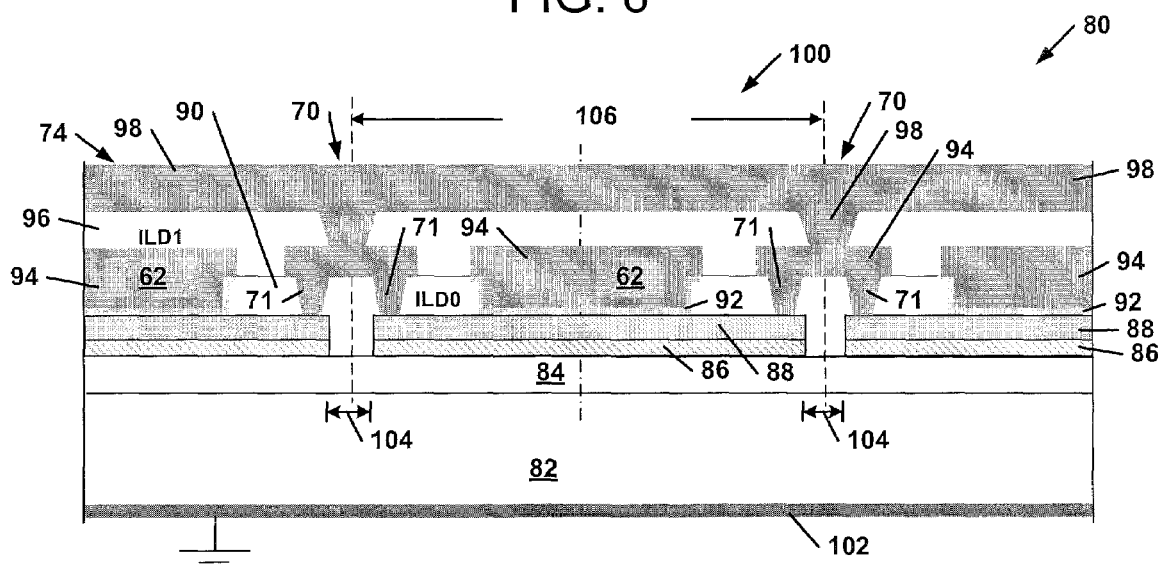
FIG. 7 is a cross-section view of the shunt capacitor design of FIG. 5, taken along line 7-7.

FIG. 7 is a cross-section view of the shunt capacitor design of FIG. 5, taken along line 7-7. The cross-section view of FIG. 7 is similar to that of FIG. 6, with the exception that the cross-section is taken at a location further away from the wire bond pad in the layout 60 of FIG. 5. In particular, in FIG. 7, M2 layer 98 is coupled to the extension of the ground shield 74 and thus forms a complete cover over the capacitor structure unit cells 100 with connections to the stacked structures (70 and 71) on the length sides of each unit cell 100. As a result, a grounded chamber is formed for isolating a portion of each unit cell. As discussed herein, the boundary 72 of the ground shield 74, and thus the ground shield 74, extends over a desired portion of each unit cell 100.

The extension of the ground shield structure above of the capacitor top plate reduces external interference, which can originate from bond wires that may overhang the shunt capacitor. In addition, the U-shape structure (70,71) connected to the ground shield/plate 74 along the three sides of the unit cell 100 thus advantageously forms a ground wall, which further reduces a parasitic interference external to the cell. As a result, these features and structures drastically improve the shunt capacitor RF performance.

Figure 8:
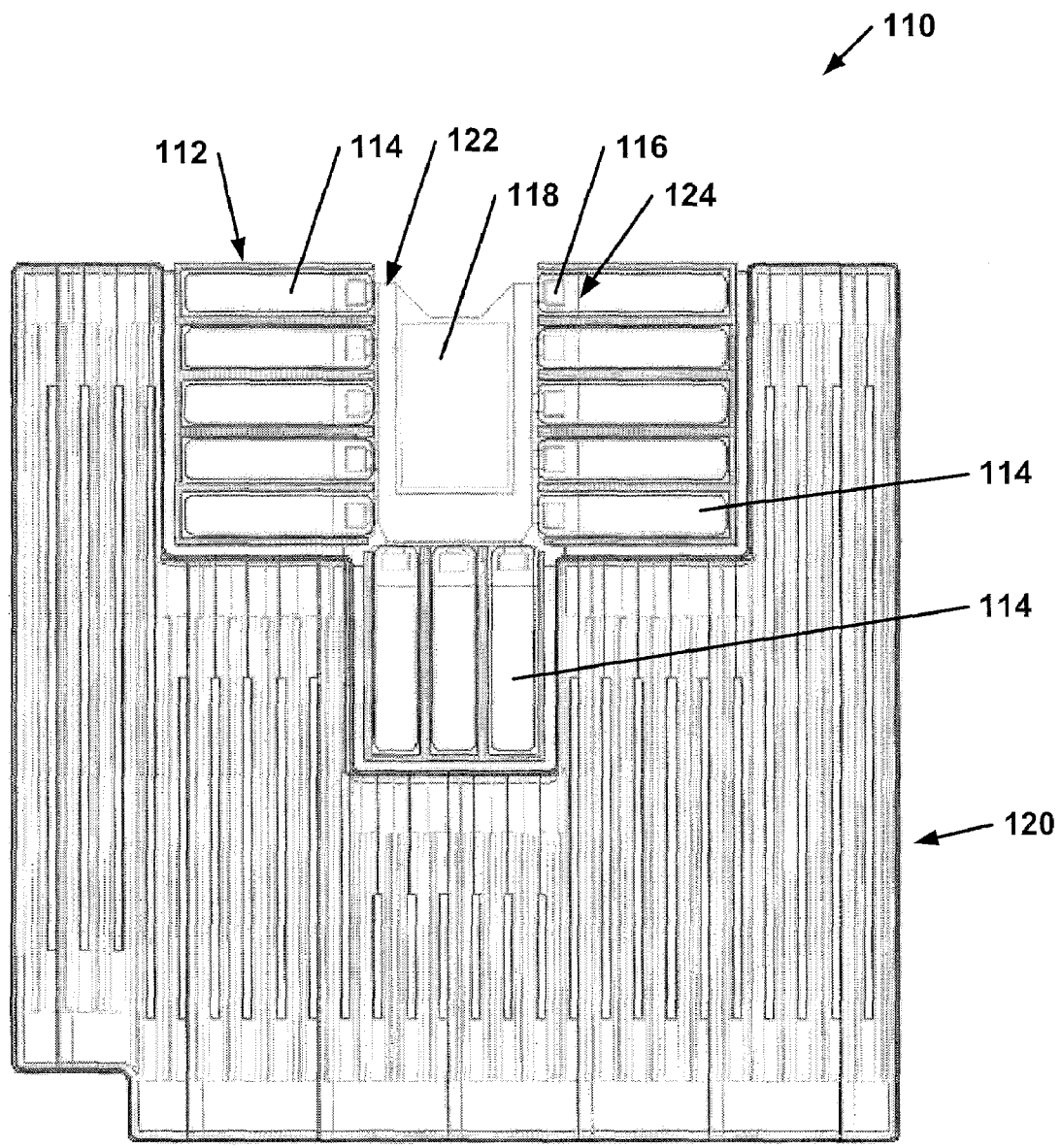
FIG. 8 is a top down layout view of a portion of a shunt capacitor design as implemented in an output impedance matching network for an RF power transistor according to another embodiment of the present disclosure, with some features illustrated in a transparent view.

FIG. 8 is a top down layout view of a portion 110 of a shunt capacitor design as implemented in an output impedance matching network 120 for an RF power transistor according to another embodiment of the present disclosure, with some features illustrated in a transparent view. The capacitor arrangement in association to the wire bond location is also important to the RF performance of the shunt capacitor in the input and output impedance matching network. FIG. 8 is the top view of the shunt capacitor unit cell arrangement 112 according to the embodiments of the present disclosure, wherein the shunt capacitor arrangement includes unit cells disposed around a bonding pad 118. In one embodiment, the shunt capacitor unit cell arrangement 112 includes first, second, and third pluralities 114 of unit cells 110 disposed around three side edges of bond pad 118, respectively. In other words, the shunt capacitor unit cell 100 is replicated along three sides of the bonding pad 118, forming three banks of capacitor units 114. Each bank of capacitor units 114 is coupled to one side of bonding pad 118 through the metal extension 122 at connections 116. The edge 124 of the ground shield (126 of FIG. 9) is indicated, wherein the ground shield is coupled to respective bottom plates of the bank of capacitor units 114, similarly, as discussed herein with respect to the embodiments of FIGS. 4-7.

Figure 9:
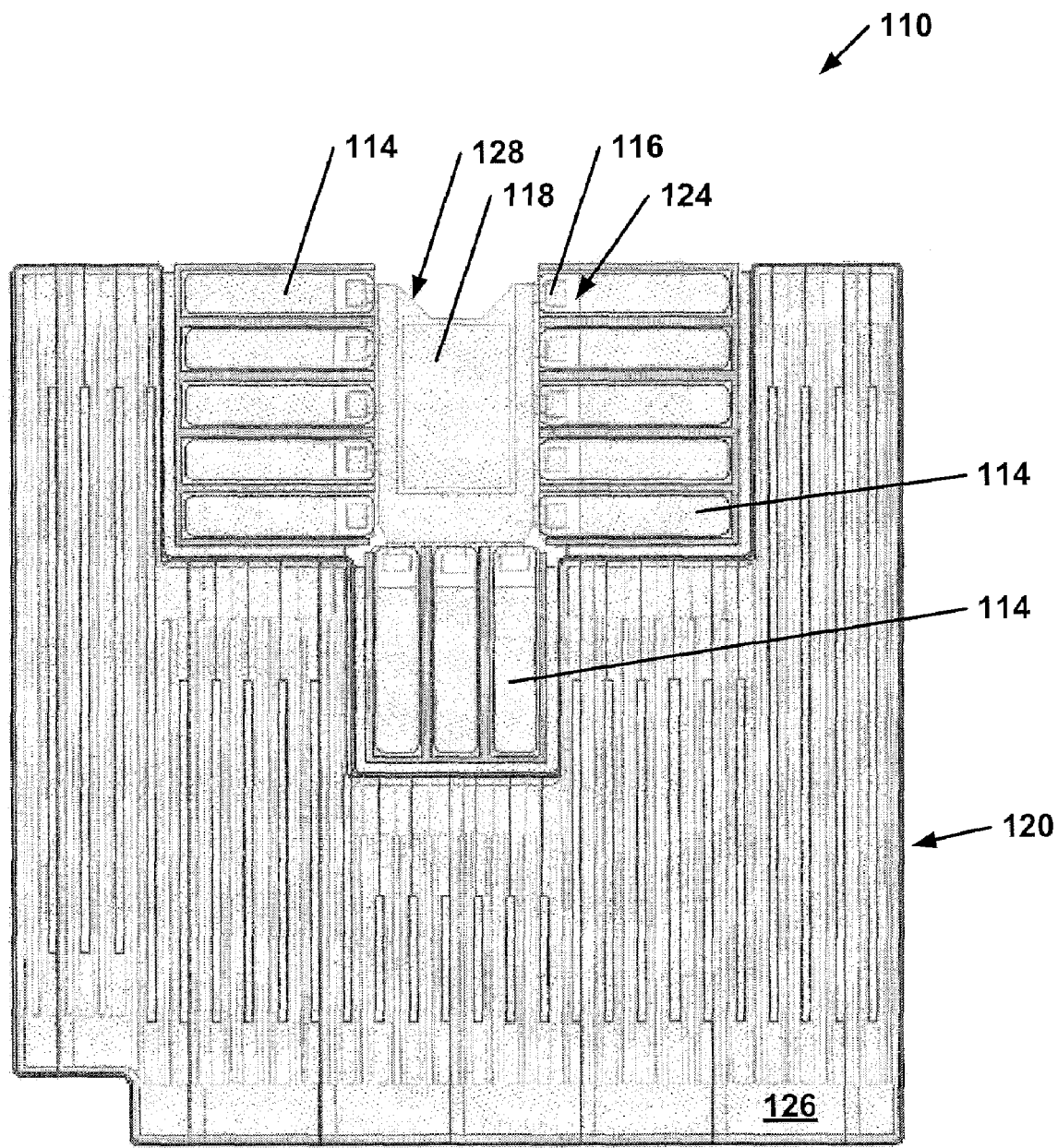
FIG. 9 is a top down layout view of the portion of the shunt capacitor design of FIG. 8, with the transparent view features of FIG. 8 illustrated in an opaque view.

FIG. 9 is a top down layout view of the portion 110 of the shunt capacitor design of FIG. 8, with the transparent view features of FIG. 8 illustrated in an opaque view. FIG. 9 is similar to FIG. 8; however a top metallization is illustrated in FIG. 9. The top metallization includes region 128. The top metallization further includes the U-shaped structures (indicated by reference numerals 70 and 71 in FIGS. 6 and 7) of respective ones of the bank of shunt capacitor cells 114 and ground shield 126. In addition, FIG. 9 illustrates a tight integration of the shunt capacitors to both a corresponding bond pad and the ground shield.

In other words, in FIG. 9, the top metal layer is highlighted by shading. The metal ground layer 126 includes the ground shield and extends overlying a portion of the bank of capacitor units 114 along the three sides of the wire bond pad. Metal layer 128 includes a top metal that extends from the wire bond pad to the top plate contact vias of the respective shunt capacitor units.

The small bonding pads used in the embodiments of the present disclosure replace the bus bar bonding pad of the prior known design. Accordingly, the shunt capacitor embodiments of the present disclosure can advantageously be placed closer to, and with a more uniform distance from, the bonding pad. As a result, this improves the efficiency of the charging and discharging of the shunt capacitors and reduces the series resistance from the bonding point to the shunt capacitors. The ground plate of the shunt capacitor according to the embodiments of the present disclosure also allows the shunt capacitors to be placed directly under the path of overlying bond wires (not shown). The ground plate reduces the interference interaction between current being conducted in the overlying bond wires and the shunt capacitors, which further enables the shunt capacitors to be placed in close proximity to the bond pads for obtaining the performance improvement.

Figure 10:
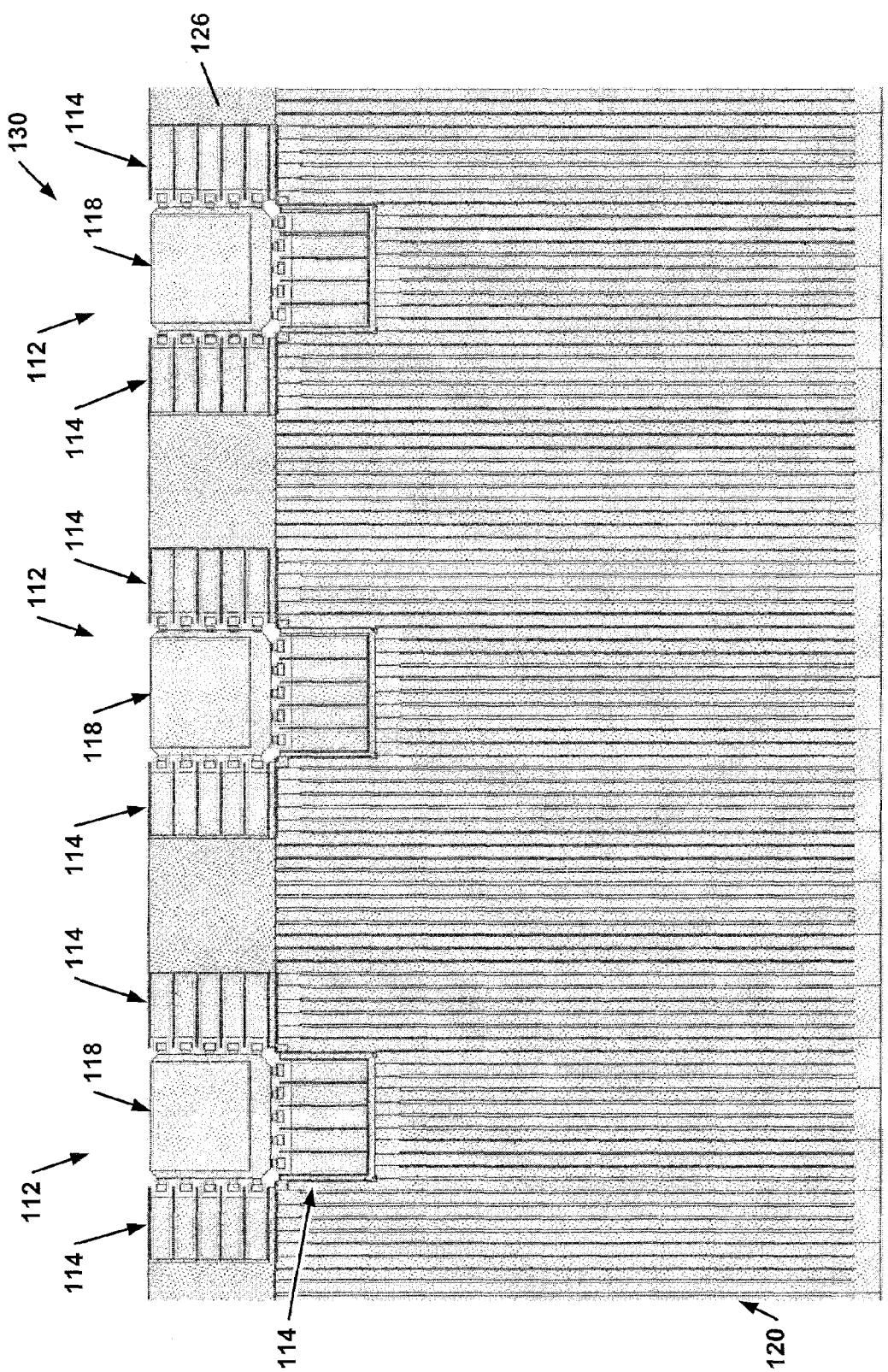
FIG. 10 is a top down layout view of a portion of a shunt capacitor design as implemented in an output impedance matching network for an RF power transistor according to another embodiment of the present disclosure.

FIG. 10 is a top down layout view 130 of a portion of a shunt capacitor design as implemented in an output impedance matching network for an RF power transistor according to another embodiment of the present disclosure. That is, FIG. 10 illustrates a plurality of shunt capacitor arrangements 112 disposed along an outer edge of an output impedance matching network 120 of an RF power transistor design. The plurality of shunt capacitor arrangements 112 include banks of shunt capacitors 114 and corresponding bonding pads 118 of a portion of output impedance matching network 120. As shown, the arrangements 112 include three banks of shunt capacitors 114, along with the ground shield 126. Each arrangement 112 has a bonding pad 118 and the shunt capacitor units 114 as previously discussed herein.

Figure 11:
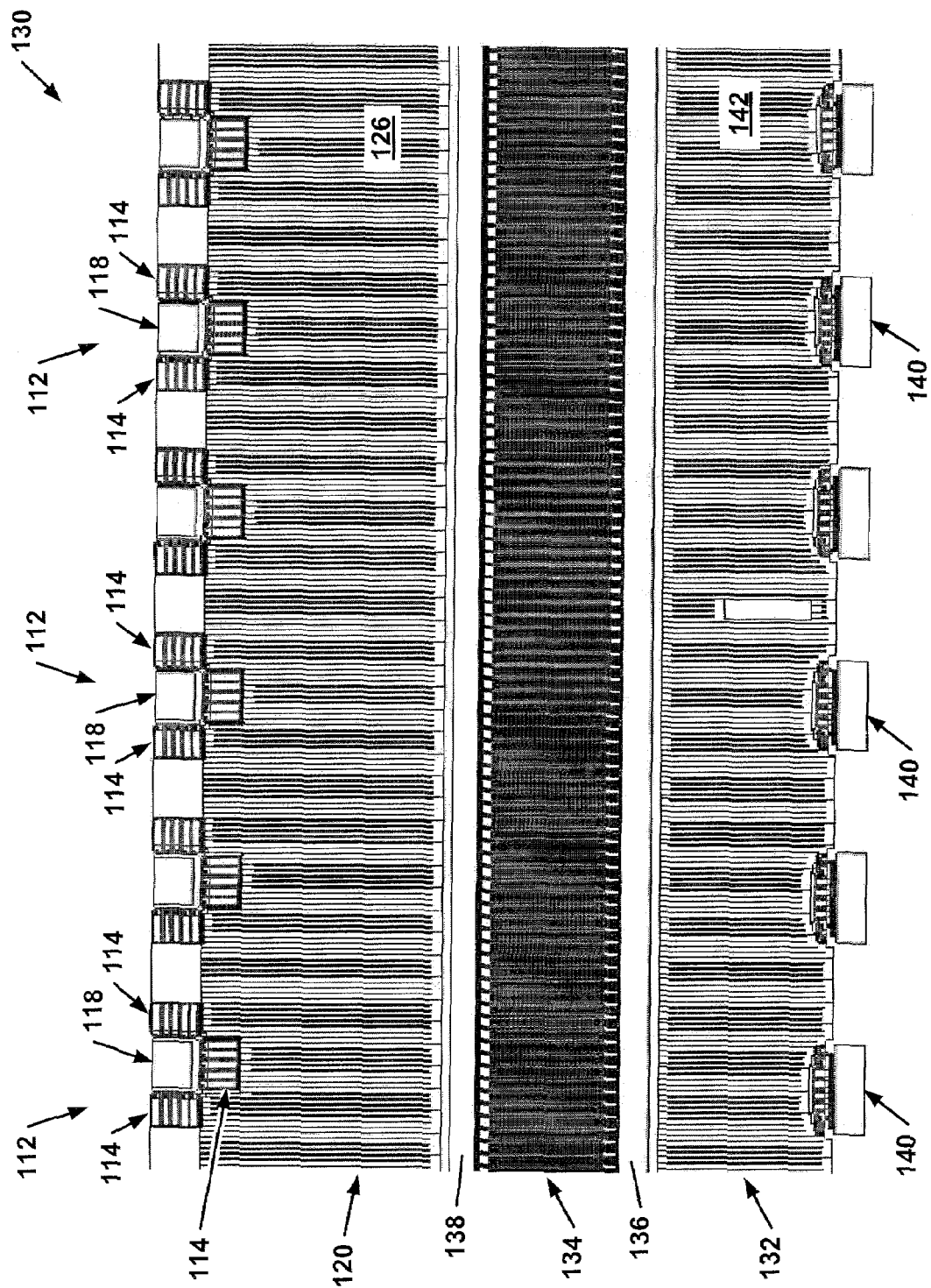
FIG. 11 is a top down layout view of an RF power transistor having a shunt capacitor design implemented in an output impedance matching network according to another embodiment of the present disclosure.

FIG. 11 is a top down layout view 130 of an RF power transistor having a shunt capacitor design implemented in an output impedance matching network 120 according to another embodiment of the present disclosure. In particular, FIG. 11 is similar to FIG. 10, only FIG. 11 illustrates a more complete layout view of an RF power transistor. FIG. 11 illustrates an integrated RF LDMOS 134 with input and output impedance matching networks, 132 and 120, respectively. Wire bond bus pads are indicated by reference numerals 136 and 138. In addition, input and output wire bond pads are indicated by reference numerals 140 and 118, respectively. The layout view 130 includes shunt capacitors as described herein with respect to the various embodiments of the present disclosure.

Accordingly, the embodiments of the present disclosure provide a novel design of shunt capacitor structures for RF power transistors. The shunt capacitor structure comprises a bottom plate having reduced resistance, wherein the bottom plate of the shunt capacitor structure includes a dual layer bottom plate structure. In one embodiment, the bottom plate comprises, for example, a polysilicon/tungsten silicide bottom plate. In addition, the bottom plate is coupled to the ground shield which has a much lower substrate resistance. Furthermore, the shunt capacitor structures of the present embodiments include top plates that comprise narrow strip plates, i.e., finger structures, as top plates of the corresponding shunt capacitor structures. In contrast, prior known shunt capacitor structures included large square/rectangular top plates. Still further, the shunt capacitor structures of the present embodiments also include a U-shaped connection to the bottom plate to further reduce a resistance and improve an efficiency of charging and discharging of the shunt capacitors. The U-shaped connection provides electrical coupling of the bottom plate to the ground shield.

The embodiments of the present disclosure further provide a novel design of shunt capacitor structures for RF power transistors by using small wire-bond pads, in contrast to a bus bar pad, thus enabling the shunt capacitor structures to be placed in a closer proximity to and at a more uniform distance from corresponding bonding points/pads. In one embodiment, a plurality of shunt capacitor structures are positioned about three sides of a wire-bond pad.

In another embodiment, a grounding shield overlies a portion of the shunt capacitor structures, wherein the overlying portion is greater than a given percentage of a shunt capacitor structure layout. The percentage of coverage can be determined according to the requirements of a given RF power transistor application. For example, the percentage of coverage can be on the order of greater than twenty-five percent (25%), fifty percent (50%), seventy-five (75%), or other percentage as determined according to the requirements of a given RF power transistor application. Accordingly, the overlying ground shield extends over a portion of the shunt capacitor structures to advantageously reduce an interference of the wire bond wires to the shunt capacitor structures.

The shunt capacitor structures according to the embodiments of the present disclosures enable a high voltage RF power transistor design with improved power, gain, and efficiency characteristics. In one embodiment, a plastic package RF LDMOS transistor application comprises an output impedance matching network that includes shunt capacitor structures according to the embodiments of the present disclosure. In addition, the shunt capacitor structures of the present disclosure enable a high power RF power transistor plastic package performance that has previously been unattainable with the prior known shunt capacitor design in plastic packaging.

In the foregoing specification, the disclosure has been described with references to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, one embodiment of the present disclosure includes an RF-LDMOS 125W power transistor used for example, in a communication device or the like. The embodiments of the present disclosure can also apply to any suitable RF MOSFET devices.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated shunt capacitor comprising:
   a conductive bottom plate;
   a capacitor dielectric overlying a portion of the bottom plate;
   a conductive top plate overlying the capacitor dielectric;
   a shield overlying a portion of the top plate, wherein the shield is isolated from the top plate; and
   a metallization feature disposed (i) along at least two sides of the top plate and (ii) isolated from the at least two sides of the top plate, wherein the metallization feature electrically couples the bottom plate to the overlying shield, further wherein (iii)(a) the metallization feature that extends along and is isolated from the sides of the top plate, (iii)(b) the bottom plate, and (iii)(c) the overlying shield together form a grounded chamber for isolating a corresponding portion of the integrated shunt capacitor from parasitic interference external to the integrated shunt capacitor.

2. The shunt capacitor of claim 1, further comprising:
   a bond pad disposed adjacent to the top plate, wherein a top metal metallization couples the bond pad to the top plate, in a region of the top plate not covered by the shield overlying a portion of the top plate.

3. The shunt capacitor of claim 1, wherein the metallization feature comprises a U-shaped feature, as viewed from a top down perspective.

4. The shunt capacitor of claim 3, further wherein the U-shaped feature extends along a first dimension on two sides and along a second dimension on a third side of the shunt capacitor.

5. The shunt capacitor of claim 1 wherein the metallization feature includes both a first layer metallization metal and a second layer metallization metal.

6. The shunt capacitor of claim 1, wherein the shield comprises a grounding shield, the grounding shield including a metallization coupled to a ground potential.

7. The shunt capacitor of claim 6, further wherein coupling together of the bottom plate, metallization feature, and grounding shield reduces a series resistance of the bottom plate to ground potential.

8. The shunt capacitor of claim 6, wherein the shunt capacitor comprises a unit cell implementation.

9. The shunt capacitor of claim 8, wherein the bottom plate, metallization feature, and grounding shield provide a grounded chamber for isolating a corresponding portion of the unit cell from external interference.

10. The shunt capacitor of claim 8, further comprising:
    a plurality of unit cell implementations disposed adjacent to one another, wherein bottom plates of adjacent unit cell implementations are merged together.

11. The shunt capacitor of claim 1, wherein the shunt capacitor is implemented in an impedance matching network of a radio frequency (RF) power transistor.

12. The shunt capacitor of claim 1, further comprising:
    a semiconductor substrate; and
    an isolation layer overlying the substrate, wherein the bottom plate overlies the isolation layer.

13. The shunt capacitor of claim 1, wherein the bottom plate comprises tungsten silicide and wherein the capacitor dielectric comprises nitride.

14. The shunt capacitor of claim 1, wherein the portion of the top plate shielded by the shield comprises a percentage of the top plate tailored according to requirements of a given radio frequency (RF) power transistor application.

15. A radio frequency (RF) power transistor having an impedance matching network including an integrated shunt capacitor as claimed in claim 1.

16. An integrated shunt capacitor comprising:
    a conductive bottom plate;
    a capacitor dielectric overlying a portion of the bottom plate;
    a conductive top plate overlying the capacitor dielectric;
    a shield overlying a portion of the top plate. wherein the shield comprises a grounding shield, the grounding shield including a metallization coupled to a ground potential; and
    a metallization feature disposed about and isolated from at least two sides of the top plate, the metallization feature for coupling the bottom plate to the shield,
    wherein the shunt capacitor comprises a unit cell implementation,
    wherein the bottom plate, metallization feature, and grounding shield provide a grounded chamber for isolating a portion of the unit cell from external interference, and
    wherein the grounded metallization feature extending along three sides of the unit cell forms a grounded wall for reducing a parasitic interference external to the unit cell.

17. An integrated shunt capacitor comprising:
    a conductive bottom plate;
    a capacitor dielectric overlying a portion of the bottom plate;
    a conductive top plate overlying the capacitor dielectric;
    a shield overlying a portion of the top plate; and
    a metallization feature disposed about and isolated from at least two sides of the top plate, the metallization feature for coupling the bottom plate to the shield, wherein the shunt capacitor comprises a unit cell implementation, further comprising:
    a bonding pad; and
    an arrangement of shunt capacitor unit cells disposed around at least two side edges of the bonding pad.

18. The shunt capacitor of claim 17, wherein the shield further includes overlying a portion of the top plate of each unit cell of the arrangement of shunt capacitor unit cells disposed around the bonding pad.

19. The shunt capacitor of claim 18, wherein the arrangement includes first, second, and third pluralities of unit cells disposed around three side edges of the bonding pad, respectively.

20. The shunt capacitor of claim 19, further wherein each plurality of unit cells is coupled to a corresponding side of the bonding pad through a metallization extension coupled to a corresponding top plate contact via of each unit cell of each plurality of unit cells.

* * * * *